(12) United States Patent
Gebele et al.

(10) Patent No.: US 6,881,270 B1
(45) Date of Patent: Apr. 19, 2005

(54) ELECTRODE ARRANGEMENT

(75) Inventors: Thomas Gebele, Freigericht (DE); Jurgen Henrich, Limeshain (DE); Stefan Bangert, Steinau (DE); Jürgen Honekamp, Hanau (DE); Elisabeth Budke, Hürth (DE); Jürgen Ulrich, Schöneck (DE); Helmut Grimm, Darmstadt (DE)

(73) Assignee: Applied Films GmbH & Co. KG, Alzenau (DE)

( * ) Notice: Subject to any disclaimer, the term of this patent is extended or adjusted under 35 U.S.C. 154(b) by 335 days.

(21) Appl. No.: 09/710,769

(22) Filed: Nov. 9, 2000

(30) Foreign Application Priority Data

Nov. 17, 1999 (DE) .......................... 199 55 373
May 19, 2000 (DE) .......................... 100 24 827

(51) Int. Cl.[7] ................ C23C 16/00; H05H 1/02
(52) U.S. Cl. .............. 118/726; 118/723 R; 118/720; 427/580
(58) Field of Search ................. 118/726, 723 R, 118/719, 720, 715, 725, 730, 727, 716, 723 CB, 723 EB, 723 FE, 723 FI, 723 MP, 723 VE, 718, 504; 204/298.41, 298.01, 298.02, 192.38; 427/580, 569, 576, 581; 313/395.1

(56) References Cited

U.S. PATENT DOCUMENTS 4,868,003 A * 9/1989 Temple et al. .............. 118/719
5,009,922 A * 4/1991 Harano et al. .............. 427/571
5,015,493 A * 5/1991 Gruen ....................... 427/571

FOREIGN PATENT DOCUMENTS

| DE | 4026494 A1 | 2/1992 | |
|---|---|---|---|
| EP | 1103630 A1 * | 5/2001 | ........ C23C/14/32 |
| JP | 11-100661 A * | 4/1999 | ........ C23C/14/24 |
| JP | 2001/192815 A * | 7/2001 | ........ C23C/14/24 |
| WO | WO-98/58095 * | 12/1998 | ........ C23C/14/30 |
| WO | WO0046418 | 8/2000 | |

OTHER PUBLICATIONS

Search Report from corresponding European Application No. EP 00 12 4558, dated Mar. 13, 2001.

* cited by examiner

*Primary Examiner*—Parviz Hassanzadeh
(74) *Attorney, Agent, or Firm*—Van Dyke, Gardner, Linn & Burkhart, LLP

(57) ABSTRACT

An electrode arrangement for the plasma-aided coating of a substrate (3) with a layer of material comprising at least one first and a second material component and for the production of a plasma discharge, more especially an arc discharge (35), having an anode arrangement (5), which provides the first material component at an anode material surface (13) for evaporation, and a cathode arrangement (7), which provides the second material component at a cathode material surface (25). The electrode arrangement is characterized in that the cathode material surface (25) is constituted by an evaporation-active part (27) supporting the plasma discharge (35) and an evaporation-inactive part (41) not supporting the plasma discharge. Preferably, a motion-producing means (49) is provided for moving the evaporation-inactive part (41) over the cathode material surface (25) in order to reduce deposit of material due to he first material component on the cathode material surface (25).

33 Claims, 4 Drawing Sheets

000
ELECTRODE ARRANGEMENT

BACKGROUND OF THE INVENTION

The invention relates to an electrode arrangement for plasma-aided coating.

Such an electrode arrangement is, for instance, employed to deposit one or more layers of a material on a substrate surface so that the substrate offers certain physical properties over its surface. Applications are, for example, the coating of a glass sheet with an optically active layer so that the glass sheet will possess desired reflecting or, respectively, transmission properties, or, as another example, the coating of a plastic foil with a layer of a material so that the plastic foil will be active as a diffusion barrier.

The patent publication PCT/EP 99/00768 discloses an electrode arrangement for the coating of a substrate with a layer of a material, which comprises two material components, the second material component being comprised as a doping agent in the material layer to a lesser extent than the first material component. The first material component is provided by evaporation from a crucible, whereas the second material component is provided from the surface of an electrode, which is placed in a circuit as a cathode in relation to the crucible. Between the cathode and the crucible playing the role of an anode, an arc discharge is struck using a suitably selected potential difference between the anode and the cathode and a gas present between the anode and the cathode. Owing to such arc discharge particles of the second material component become detached from the cathode surface, mix and react with the particles of the first material component evaporated from the anode with the result that a material layer is deposited on a substrate surface arranged in the vicinity of the cathode and of the anode, such deposited material layer containing both the two material components. The proportions of the two material components in the deposited material layer may be challenged because the degree of evaporation from the crucible and the intensity of the arc discharge may be varied to a certain degree independently of each other.

The intensity and efficiency of the arc discharge is, in this case, influenced by the surface properties of the cathode. In the case of the conventional electrode arrangement, there is a problem to the extent that particles evaporated from the anode of the first material component or, respectively, reaction products thereof deposit on the surface of the cathode constituting the second material component. This means that the surface properties of the cathode change during the operation of the electrode arrangement, something leading to a change with time in the intensity and the efficiency of the arc discharge and accordingly to an impairment regarding deposition of material layers with a predetermined composition on the substrate. More particularly, it may be the case that deposits of the first material component on the cathode may result in the arc discharge being extinguished and further operation of the electrode arrangement with the contaminated cathode being impossible. Then replacement of the cathode is essential, and this will mean a disadvantage regarding the efficiency of production of the material layer.

SUMMARY OF THE INVENTION

One object of the present invention is to design an electrode arrangement of the initially described type, which renders possible continuous coating of a substrate with a desired material composition.

In this respect, the invention takes as a starting point an electrode arrangement for the plasma-aided coating of a substrate with the material layer, which comprises at least one first and second material component. In order to produce a plasma discharge, in this case, an anode arrangement and a cathode arrangement are provided, the anode arrangement being the source of the first material component at an anode material surface for evaporation, and the cathode arrangement being the source of the second material component at a cathode material surface.

The invention is characterized in that the cathode material surface is divided up into two regions, namely an evaporation-active part supporting the plasma discharge and an evaporation-inactive part not supporting the plasma discharge. At a given size of the cathode material surface and a given intensity of the plasma discharge there is, consequently, as compared with a cathode material surface not divided into two regions, an increased intensity of the plasma discharge per unit area in the evaporation-active part.

Furthermore, in this case, a movement-producing means is provided, which changes the arrangement of the evaporation-active part on the cathode material surface with time and, thus, moves the evaporation-active part over the cathode material surface. This means that portions of the cathode material surface, which are constantly changing with time, support the plasma discharge.

In connection with the movement-producing means or, as an alternative thereto, directing protective gas onto the cathode surface as an appropriate measure, the protective gas being so caused to flow that it emerges while moving in the same direction as the evaporated particles moving away from the active cathode surface in the process chamber and prevents the evaporated material components moving from the anode material surface to the cathodes and becoming deposited there as an insulating layer. A gas inert protective gas is preferably employed. Here, the supply of protective gas onto the evaporation-active part of the cathode surface is satisfactory in such a manner that the protective gas emerges in the direction of the plasma discharge into the process chamber, although it is expedient to so arrange the supply of protective gas that the entire cathode is swilled with surrounding protective gas.

The invention is based on the notion that an intensive plasma discharge produces a cleaning action on the cathode material surface. Accordingly, deposits produced during operation of the first material component may be constantly removed again by intensive plasma discharge in order to have a plasma discharge which is constant all the time.

At any given proportion of the second material component in the deposit, there is a limit for the intensity of the plasma discharge, since otherwise the proportion of the second material component in the material layer would excessively increase. The intensity, which is accordingly so set, of the plasma discharge might then be too low to remove deposits of the first material on the cathode material surface.

The division in accordance with the invention of the cathode material surface into an evaporation-active part and an evaporation-inactive part means that by a suitable selection of the proportionate area of the evaporation-active part of the overall area of the cathode material surface it is, however, possible to bring about such an intensive development of the plasma discharge in the evaporation-active part of the cathode material surface that, here, the deposits of the first material component are substantially removed. Accordingly, the cathode material surface is locally cleaned by the arc discharge and the movement of the evaporation-active part over the cathode material surface ultimately leads to cleaning substantially the entire cathode material surface so that the cathode's surface properties remain substantially constant in time or, as compared with a conventional electrode arrangement, change less, and more especially extinction of the arc discharge due to deposits of the first material component on the cathode material surface is substantially able to be prevented.

In this respect, it will be clear that the transition between the evaporation-active part and the evaporation-inactive part of the cathode material surfaces is not microscopically sharp so that two parts may merge with each other in a more or less wide transition zone dependent on the particular design of the electrode geometry.

The movement of the evaporation-active part over the cathode material surface is preferably performed by the provision of a baffle arrangement whose baffle opening exposes the evaporation-active part for the plasma discharge and which shades of the evaporation-inactive part of the cathode material surface from the plasma discharge. This means that a drive is provided in order to move the baffle opening in relation to cathode material surface. Regarding the anode arrangement, the baffle opening is preferably arranged stationarily in this respect.

In accordance with a preferred embodiment, the cathode material is preferably a peripheral cylinder surface able to be rotated by the drive around its cylinder axis.

As an alternative and also as a preferred modality, a setup may be employed, wherein the cathode material surface is in the form of an annular surface, which is able to be rotated by a drive around a central axis extending perpendicularly to the annular surface.

Furthermore, as an alternative, a preferred form of the cathode material surface is possible as a linearly extending surface of a cathode material body, which is able to be reciprocated by the drive in one direction of the extent of the surface.

Preferably, the baffle arrangement extends around the cathode at least partly like a hood in such a manner that between the part of the baffle arrangement shading off the evaporation-inactive part from the plasma discharge and the cathode material surface an intermediate space is left. A scavenging gas is introduced into this intermediate space which escapes from the intermediate space through the baffle opening. Accordingly in the vicinity of the baffle opening and hence in the vicinity of the evaporation-active part of the cathode material surface a gas current is produced directed away from the cathode material surface. This gas current flowing away from the surface reduces the number of the particles, impinging on the cathode material surface, of the first material component or, respectively, of the reaction products thereof and consequently promotes regular operation of the electrode arrangement.

As an alternative to, or in combination with, the baffle arrangement, the configuration of the cathode material surface is preferably in the form of a convex surface so that the plasma discharge takes place in an area facing the anode of the cathode material surface hence defining the evaporation-active part. In this respect, a drive is then provided, which changes the orientation of the cathode material body in relation to the anode in order to move the evaporation-active part over the cathode material surface.

In order to promote the cleaning effect of the plasma discharge, it is preferred to provide cleaning means, which, at the evaporation-inactive part, remove deposits of material on the cathode material surface. Since the evaporation-inactive part of the cathode material surface does not take part in the plasma discharge, here, access to the cathode material surface is possible in a simple manner and any contaminating deposits which may be present on the cathode material surface can be then removed comparatively simply.

The cleaning means preferably comprise a stripping device, more especially in the form of a brush, and/or a device abrasively acting on the cathode material surface and/or a device processing the cathode material surface in a chip-removing manner. In this respect, it is also possible for the cleaning means not only to remove the deposits of material, but also part of the cathode material body itself so that same will always present a reproducible and more particularly planar cathode material surface.

In order to obtain maximum evenness of distribution in space of the particles of the second material component coming from the cathode material surface in relation to the anode, the cathode arrangement preferably comprises a plurality of evaporation-active parts, arranged at a space apart from each other, of the cathode material surface.

Although the energy supplied, owing to the arc discharge, to the first material component at least partly promotes the evaporation of such component, it is preferred to provide a heating means for the first material component. This renders it possible to set the proportions of the first and, respectively, second material component in the deposited material layer independently of each other. The heating means is preferably a heated crucible for liquefying the first material component.

In accordance with a preferred embodiment, the first material component comprises silicon and the second material component comprises copper and/or zinc or brass. This electrode arrangement is then for instance utilized for coating plastic parts, such as more particularly of polyethylene terephthalate (PET), more especially for use for packaging foodstuffs, having a material layer, which possesses a diffusion or permeation barrier function. The substrate for the coating may, here, be a packaging foil, which is moved as band material past the electrode arrangement, or it may be a question, more preferably, of a container and more especially of beverage bottles of PET, which are moved past the electrode arrangement for coating and will then preferably rotate so that the coating is deposited evenly over the periphery of the bottle. In this case, it is preferably a question of a plurality of electrode arrangements spaced apart from each other and electrode arrangements which are placed in series or are offset in relation to each other.

BRIEF DESCRIPTION OF THE DRAWINGS

The invention will now be described with reference to the accompanying drawings.

DESCRIPTION OF THE PREFERRED EMBODIMENT

Figure 1:
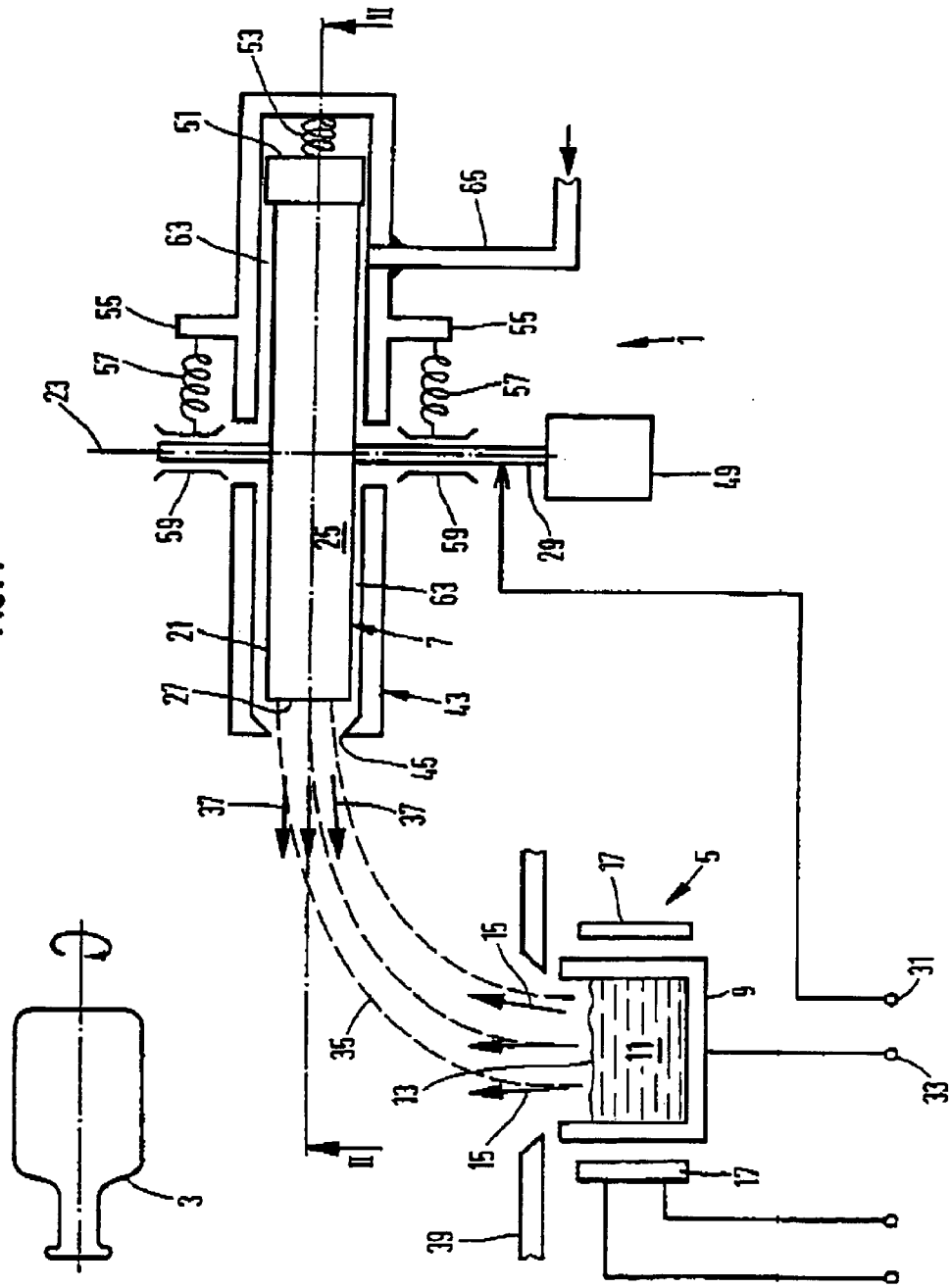
FIG. 1 diagrammatically illustrates a first embodiment of the invention in cross section.

FIG. 1 shows an electrode arrangement 1 for the coating of a beverage bottle 3 of PET having a material layer, acting as a diffusion barrier, essentially of $SiO_x$, doped with metal atoms. The coating takes place in a vacuum atmosphere at a pressure of approximately $2 \times 10^4$ mbar. The electrode arrangement 1 comprises an anode arrangement 5 and a cathode arrangement 7.

The anode arrangement 5 comprises a crucible 9 receiving silicon melt 11, from whose surface 13 silicon particles evaporate into the gas space over the crucible 9 toward beverage bottle 3. Arrows 15, in this case, symbolize particles evaporating from the silicon surface 13.

The crucible 9 is heated with the aid of an electrical heating means 17 to which heating energy is supplied via leads 19 from a controlled power supply, not illustrated. The anode arrangement 5 is generally the same as the arrangement as described in the said patent publication PC/EP 99/00768 which is incorporated herein in its entirety by reference.

The cathode arrangement 7 comprises a cylindrical cathode body 21 of brass whose cylinder axis is referenced 23 and whose peripheral cylinder surface is referenced 25, a part 27, which is adjacent to the silicon melt 11, of the peripheral cylinder surface 25 being set orthogonally and with an oblique offset in relation to the surface 13 of the silicon melt 1. The cylindrical body 21 of brass is joined electrically with a lead 31 through a shaft 29 connected fixedly to it and extending along the cylinder axis 23.

Furthermore, the silicon melt 11 is joined electrically via the crucible 9 with a lead 33, the leads 31 and 33 being so connected with a further controlled power supply, not illustrated, that the cylinder body 21 is connected as a cathode and the silicon melt 11 is connected as an anode. By suitably setting the voltage between the leads 31 and 33, an arc discharge is maintained between the cathode arrangement 7 and the anode arrangement 5, chained lines 35 indicating paths of arc sparks. The arc discharge may be struck by means of one or more auxiliary electrodes, not illustrated in the figures. From the cylinder body 21, the arc discharge dislodges particles at the part 27, which is adjacent to the anode arrangement 5, of the cylinder periphery face 25, and such particles move in a direction as indicated by arrows 37 in FIG. 1, toward the gas space between the silicon surface 13 and the beverage bottle 3 to be coated. Here, the metal particles 37 mix with the silicon particles 15, there also being a reaction between the particles and with the gas atmosphere present taking place there finally being a deposition of the particles and their products of reaction on the beverage bottle 3 to give the desired material layer. In this case, the particles evaporated from the brass cylinder 21 form a proportion of the material layer which is small in comparison with the material particles evaporated from the silicon surface 13 so that the former particles may be considered as doping the $SiO_x$ material layer.

A baffle 39 is provided over the crucible 9 and the heating means 17 for the protection of same, the baffle 39 being held at a floating potential in relation to the silicon melt 11 and the brass cylinder 21.

Owing to field effect in the part 27, facing the anode arrangement 5, of the peripheral cylinder face 25, the discharge sparks 35 are formed so that, here, an evaporation-active part 27 of the peripheral cylinder face 25 is formed, whereas the remaining part 41 of the peripheral cylinder face 25 does not constitute any striking points for spark discharges 35 and accordingly is an evaporation-inactive part 41 of the peripheral cylinder face 25. The evaporation-active part 27 is, however, not only limited by the field effect to the part, which faces the anode arrangement 5, of the peripheral cylinder face 25, but also by the action of a baffle arrangement 43, which encircles the brass cylinder 21 essentially completely like a hood and in its part facing the anode arrangement 5 has a baffle opening 45. The baffle opening 43 is at a floating potential in relation to the silicon melt 11 and the brass cylinder 21 so that the baffle arrangement 43 screens off the brass cylinder 21 in the evaporation inactive part 41 of the peripheral cylinder face 25 from sparks 35. The particles 15 starting at the surface 13 of the silicon melt 11 are subject to dispersion in the gas space between the silicon melt 11 and the beverage bottle 3 and also react with gas particles so that particles also thus move toward the peripheral cylinder face 25, as indicated by the arrows 47 in FIG. 2. These particles lead to deposits of material, mostly silicon oxide, on the peripheral cylinder face 25 and therefore lead to an intensity of the arc discharge 35 varying with time.

Owing to the limitation of the evaporation-active part 27 of the peripheral cylinder face 25 to only one part of the peripheral cylinder face 25 and the corresponding amplification of the intensity of the arc discharge in the evaporation-active part 27, it is, however, possible to make the intensity of the arc discharge so high that the arc discharge 35 even frees the peripheral cylinder face 25 from deposits 47 of silicon and compositions thereof that by means of the peripheral cylinder face 25 conditions for the arc discharge 35 may be provided which are substantially constant in time. In order to constantly free the area, which is provided for evaporation, of the peripheral cylinder face 25 of deposits, a motor 49 is provided, which so turns the shaft 29 and hence the peripheral cylinder face 25 in relation to the baffle arrangement 43 that progressively every part of the peripheral cylinder face 25 is treated as an evaporation-active part 27 by the intensive plasma discharge 35 and therefore freed of deposits 47.

In addition to cleaning by the arc discharge 35, the peripheral cylinder face 25 is cleaned by a drag member 51 thrust in the evaporation-inactive part 41 by means of a spring 53, bearing on the baffle arrangement 43, against the peripheral cylinder face 25. On rotation of the brass cylinder 21 about the cylinder axis 23, the drag member 51 removes deposits 47 of material from the peripheral cylinder face 25 maintaining same in a substantially planar state since roughness produced owing to the arc discharge 35 in the evaporation-active part 27 is abraded or ground away.

Abutments 55 are fixedly arranged on the baffle arrangement 43, which via springs 57 bias bearings 59 of the shaft 29 toward the anode arrangement 5. This means that the brass cylinder 21 has its peripheral cylinder face 25 thrust against roller bearings 61 arranged adjacent to the baffle opening 45 in the evaporation-inactive part 41 of the peripheral cylinder face 25. This means that with the progress of removal of material from the brass cylinder 21 owing to the evaporation action by the arc discharge 35 and the grinding by the drag member 51 and the resulting reduction in diameter of the brass cylinder 21, the evaporation-active part 27 of the peripheral cylinder face 25 is always kept in substantially the same spatial relationship to the baffle opening 45 and the anode arrangement 5 so that it is possible to maintain arc discharge which is substantially constant in time independently of the removal of material from the brass cylinder 21.

In an intermediate space 63 between the peripheral cylinder face 25 and the baffle 43, a gas, as for example oxygen, is introduced via a line 65. At least a part of the gas supplied via the line 65 escapes from the intermediate space 63 through the baffle opening 45 toward the gas space between the silicon melt 11 and the beverage bottle 3, as indicated by the arrows 65 in FIG. 2. The resulting gas current 35 is directed oppositely to the direction 47 of movement of the particles leading to an undesired deposit on the peripheral cylinder face 25. In this respect, gas particles 35 will collide with the current of undesired particles 47 and deflect same from their path through the baffle opening 45 and prevent later deposit on the peripheral cylinder face 25 so that the undesired effect of deposit of material on the peripheral cylinder face 25 is also reduced.

Following, modifications of the embodiment of the invention disclosed in FIGS. 1 and 2 will be explained. Here, corresponding parts are provided with the same reference numerals as in FIGS. 1 and 2, although to distinguish them they are provided with a supplementary letter. Moreover, reference should be had to the entire preceding description.

Figure 3:
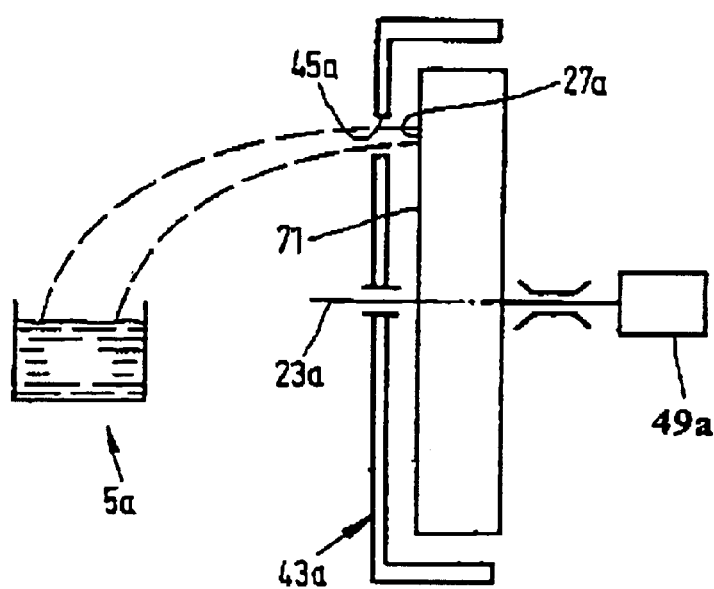
FIG. 3 is a representation corresponding to FIG. 1 of a second embodiment of the invention.

FIG. 3 shows a further embodiment of the invention, which is generally similar to the previously described embodiments and only differs regarding a different configuration of the cathode material body, which is as well in the form of a brass cylinder 21a though being able to be rotated about an axis 23a of rotation extending toward an anode arrangement 5a so that an evaporation-active part 27a of the surface of the brass cylinder 21a is arranged on one end face of the cylinder 21a. On rotation of the brass cylinder 21a by a motor 49a about the axis 23a of rotation, the evaporation-active part 27a will describe an annular surface on the cylinder floor 71. The evaporation-active part 21a of the cylinder floor face 71 is, in this case, defined by a baffle opening 45a of a baffle arrangement 43a shading off the remaining part of the cylinder floor surface.

Figure 4:
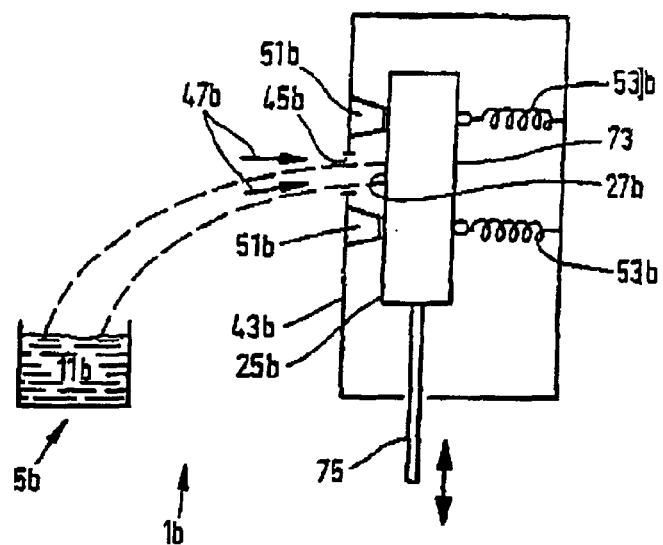
FIG. 4 is a representation corresponding to FIG. 1 of a third embodiment of the invention.

In the case of the electrode arrangement 1b depicted in FIG. 4, the brass body is designed in the form of a rod 41b extending in the longitudinal direction whose flat side 25b facing an anode arrangement 5b is substantially shaded by a baffle arrangement 43b, in which a baffle opening 45b is practiced to limit an evaporation-active part 27b on the flat side 25b. Springs 53b, which bear against the baffle arrangement, 43b, engage the flat side 73, which is directed away from the flat side 25b, of the brass rod 41b, such springs thrusting the rod 41b at its flat side 25b toward the anode arrangement 5b and against drag members 51b, which are secured to the baffle arrangement 43b. The brass rod 41b is coupled with a drive rod 75, which for its part is joined with a drive, not illustrated in FIG. 4, in order to reciprocate the rod 41b. Owing to the reciprocation, the evaporation-active part 27b of the flat side 25b is also reciprocated on same so that gradually different areas of the flat side 25b act as evaporation-active parts 27 so that the unfavorable effect of the deposit of particles 47b is reduced, which originate from the silicon melt 11b.

Figure 5:
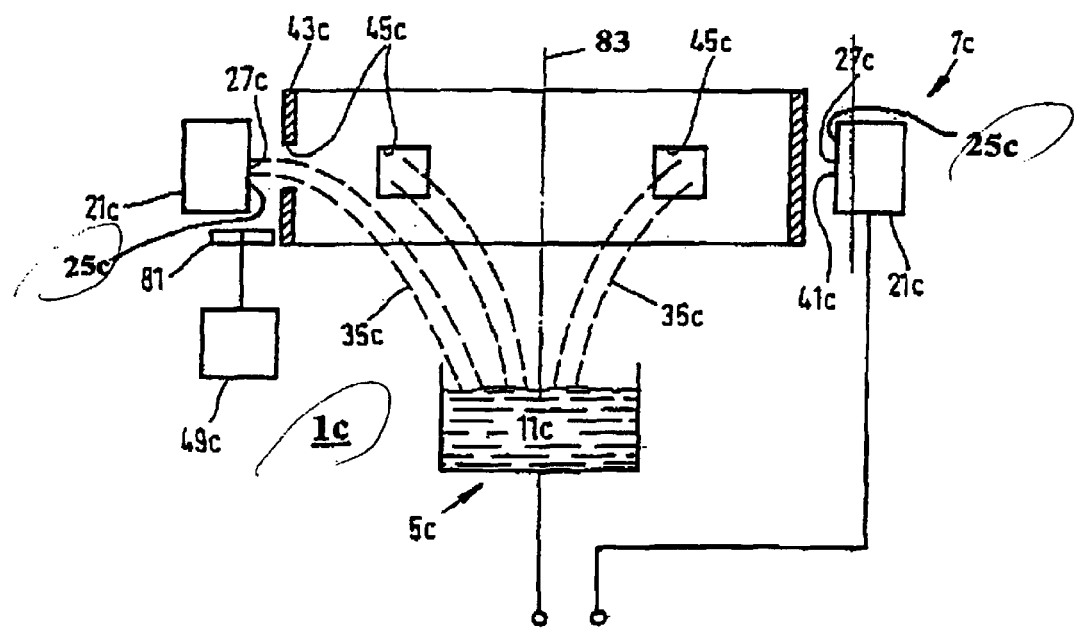
FIG. 5 is a representation corresponding to FIG. 1 of a fourth embodiment of the invention.

FIG. 5 diagrammatically shows an electrode arrangement 1c with an anode arrangement 5c, which also includes a silicon melt 11c, and a cathode arrangement 7c. The cathode arrangement 7c comprises, in this case, a cathode material ring 21c of brass, which is stationary in relation to the anode arrangement 5c and is arranged centrally above the silicon melt 11c. Radially within the brass ring 21c, an annular baffle 43c is arranged driven by means of a motor 49c and a friction roller 81 for rotation about its axis 83 of symmetry. The annular baffle 43c shades off a large part of the peripheral cylinder face 25c of the brass ring 21c, while a plurality of baffle openings 45c distributed in the peripheral direction in the annular baffle 43c expose evaporation-active part 27c on the cylinder inner face 25c of the brass ring 21c to the arc discharge 35c, all other areas of the cylinder inner face 25c being shaded off, as evaporation-inactive parts 41c, from the arc discharge 35c. The rotation of the annular baffle 43c about its axis 83 means that the evaporation-active parts 27c are moved in the peripheral direction over the cylinder inner face 25c of the brass ring 21c so that progressively the entire inner face 25c is subjected to the cleaning action due to the intensive arc discharge 35c in order to remove material deposits, originating from the silicon melt 11c, thereon.

Figure 2:
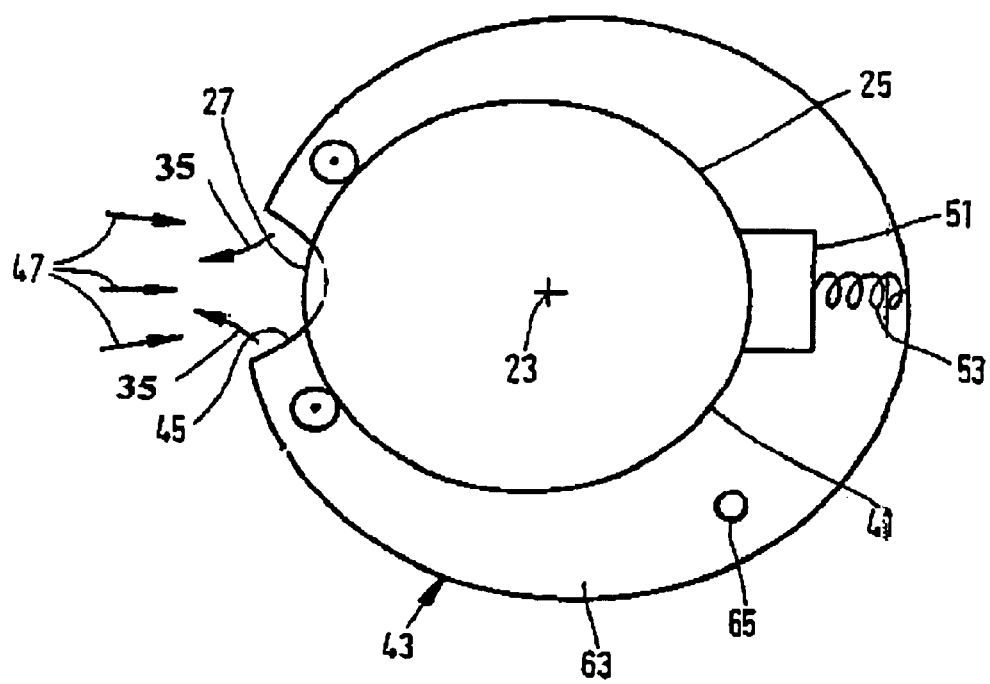
FIG. 2 shows a section taken through the cathode arrangement in FIG. 1 taken on the section line II—II.

In the case of embodiments of FIGS. 1 and 2 and also of FIG. 4, the cleaning of the cathode material face is aided by the action of drag members. Such measures can also be adopted in the embodiment of the invention in FIGS. 3 and 5. In this case, it is possible to have stripping means, as an alternative to drag members, in the form of brushes or chip-removing devices such as rotary chisels or routers. These cleaning devices could, in this case, also be moved in relation to the baffle arrangement, like rotary brushes or routers. Furthermore, the cleaning means can envisage the use of the physical or mechanical techniques, such as ion bombardment or etching, and the like.

In order to reduce the impingement of undesired particles on the cathode material surface and the adhesion thereon, the embodiment in accordance with FIGS. 1 and 2 comprises a gas supply means, which produces a gas current from the baffle opening. Such measures may be adopted as well in the embodiments of FIGS. 3 through 5.

Figure 6:
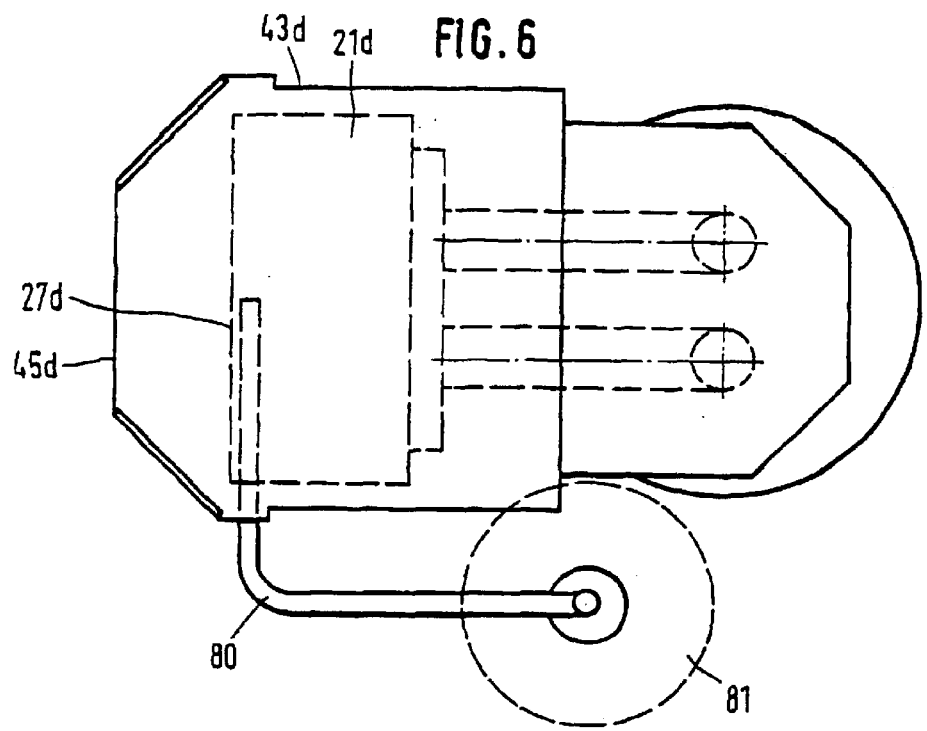
FIGS. 6 and 7 depict embodiments with a stationary electrode arrangement.
Figure 7:
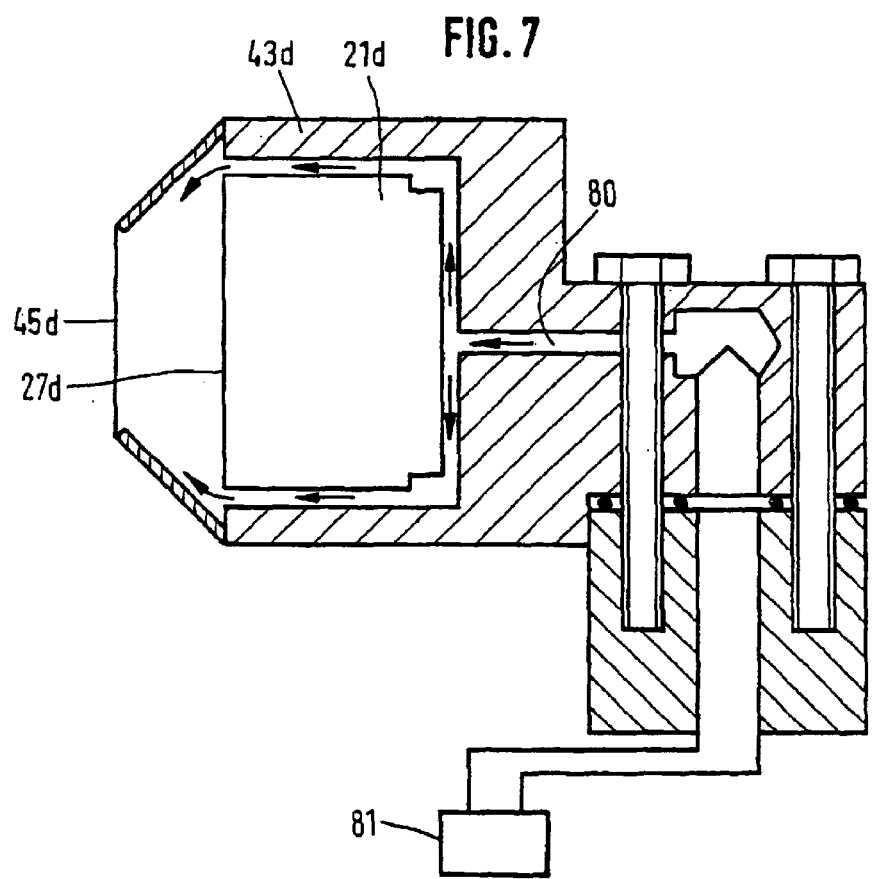

In the case of the embodiments depicted in FIGS. 6 and 7, it is a question of stationary electrode arrangement, in which both the baffle and also the cathode are stationary, that is to say they are non-rotary or are able to be moved in translation for operations. In the embodiment of FIG. 6, the baffle is referenced 43d, it fitting over the cathode 21d, only indicated in chained lines, like a hood. On its font side, the hood 43d possesses a baffle opening 45d uncovering the evaporation-active part 27d of the cathode 21d for the arc discharge. The remaining parts of the electrode arrangement are of conventional design so that further details of the construction thereof are unnecessary. However, through the gas supply line 80, an inert protective gas, and more particularly oxygen, argon or an oxygen-argon gas mixture or another suitable gas mixture, is supplied to the area of the evaporation-active part 27d of the cathode within the hood 43d from a protective gas source 81 only indicated in chained lines. The protective gas thus introduced directly in front of the cathode surface, which, in the present case, is introduced adjacent to the baffle opening 45d, emerges through the baffle opening 45d together with the particles evaporated from the evaporation-active part 27d of the cathode, through the baffle opening 45d so that a self-supporting plasma, may be produced and maintained independently from the Si vapor cloud. Owing to the decoupling from the Si vapor cloud, the arc discharge, and accordingly the plasma process, may be maintained in a substantially more stable manner constantly for longer process times.

This is more particularly advantageous for recharging with consumable materials. Without the supply of protective gas, the rest of the Si vapor cloud would cause such a deposit during re-charging the cathode, on the cathode that reliable restriking of the arc and/or further operate could not be ensured in a reliable manner.

In the case of the embodiment of FIG. 7, in which the same reference numerals are employed as in FIG. 6, the supply of the protective gas from the rear side of the cathode 21d, that is to say, turned away from the one side, and opposite the baffle opening 45d. This embodiment offers the advantage that the cathode is completely held within flowing protective gas and is therefore protected against entry of particles from the silicon vapor cloud. This extremely effectively prevents poisoning of the cathode surface by evaporated Si oxides, and avoiding the surface being partly covered with an insulating layer, something which would prevent striking the arc and, in the long run, would also substantially limit the use of the cathode and working life. Owing to the supply of protective gas, an area with a higher partial pressure is produced in front of the cathode surface, the protective gas emerging out through the baffle opening into the process space. The quantity of gas employed per cathode is between the 5 sccm and 50 sccm, and preferably amounts to 10 sccm.

The stationary electrode arrangement illustrated in FIGS. 6 and 7 can be arranged laterally offset above the crucible with the silicon melt. It is, however, also possible to arrange a plurality of electrode arrangements opposite to the crucible in groups or to arrange them about the periphery thereof.

In addition to the coating of beverage bottles of plastic, the electrode arrangement may be employed for all other types of coating. More particularly, the coating of flat material comes into question here, more especially in the form of band or strip. An even coating of large areas is preferably rendered possible, in this case, by arranging, a plurality of electrode arrangements in series and/or with an offset to one another.

In the case of the above-disclosed embodiments, the material layer to be deposited is an $SiO_x$, layer, which is doped with metal ions, which are dislodged from the brass cathode. The invention is, however, not limited to such material so that all other possible materials may be employed, it being possible for one major component of the material layer to be made available by anodic evaporation and for a doping component of the material layer to be made available by dislodging from a plasma discharge cathode.

The invention also envisages the provision of a cooling means for the cathode material body. Such a cooling means may, for example, be in the form of tubes with water flowing through them.

In addition to the above-described geometries of the cathode material body, other geometries are possible therefor which render possible the division of the cathode material surface into an evaporation-active part and an evaporation-inactive part The embodiments of the invention in which an exclusive property or privilege is claimed are defined as follows:

1. An electrode arrangement for the plasma-aided coating of a substrate with a layer, comprising:
   at least a first and a second material component which produces a plasma discharge;
   an anode arrangement which defines said first material component at an anode material surface for evaporation;
   a cathode arrangement which defines said second material component at a cathode material surface, said cathode material surface being constituted by an evaporation-active part supporting the plasma discharge and an evaporation-inactive part not supporting the plasma discharge;
   a gas supply for supplying protective gas in front of the cathode material surface to the evaporation-active part or the cathode material surface; and
   a baffle arrangement exposing said evaporation-active part at a baffle opening for the plasma discharge and shading of the evaporation-inactive part correspondingly from the plasma discharge;
   wherein said protective gas is so introduced into an intermediate space between the baffle arrangement and the cathode material sure that said supplied protective gas escapes at least partially through the baffle opening towards the plasma discharge from the intermediate space between the cathode material surface and the baffle arrangement.

2. The electrode arrangement in claim 1 including a gas supply for supplying protective gas in front of the cathode material surface.

3. The electrode arrangement in claim 2 wherein said protective gas is supplied at the evaporation-active part of the cathode material surface.

4. The electrode arrangement in claim 1 wherein said first and second material components produce an arc discharge.

5. The electrode arrangement in claim 1 including cleaning means for removing material deposits at said evaporation-inactive part of said cathode material surface.

6. The electrode arrangement in claim 5 wherein said cleaning means comprises a stripping means.

7. The electrode arrangement in claim 6 wherein said cleaning means comprises at least one of (i) a brush, (ii) a device abrasively treating the cathode material surface, and (iii) a device processing the cathode material surface in a chip-removing manner.

8. The electrode arrangement in claim 1 including a follow-u device which keeps a substantially constant clearance between said anode material surface and said evaporation-active part of said cathode material surface.

9. The electrode arrangement in claim 1 wherein said cathode arrangement comprises a plurality of evaporation-active parts arranged spatially apart of the cathode material surface.

10. The electrode arrangement in claim 1 wherein said anode arrangement includes a heatable crucible for liquefaction of said first material component.

11. The electrode arrangement in claim 1 wherein said first material component comprises silicon.

12. The electrode arrangement in claim 11 wherein said second material component comprises one of copper, zinc, brass and magnesium.

13. A method of using the electrode arrangement of claim 1 for the coating of packaging material.

14. A method of using the electrode arrangement in claim 1 for the coating of polyethylene terephthalate.

15. A method of using the electrode arrangement in claim 1 for coating a beverage bottle.

16. A method of using the electrode arrangement in claim 1 for coating a beverage bottle with a diffusion insulation material layer or a permeation insulation material layer.

17. A method of using the electrode arrangement in claim 1 for the coating of strip material.

18. A method of using the electrode arrangement in claim 1 for the coating of strip material in the form of a foil strip.

19. An electrode arrangement for the plasma-aided coating of a substrate with a layer, comprising:
    at least a first and second material component which produces a plasma discharge;
    an anode arrangement which defines said first material component at an anode material surface for evaporation;
    a cathode arrangement which defines said second material component at a cathode material surface, said cathode material surface being constituted by an evaporation-active part supporting the plasma discharge and an evaporation-inactive part not supporting the plasma discharge; and a motion-producing device for moving said evaporation-active part, and thereby moving said evaporation-inactive part over said cathode material surface in order to reduce deposits of material due to the first material component on said cathode material surface.

20. The electrode arrangement in claim 19 wherein said motion-producing device includes a baffle arrangement exposing said evaporation-active part at a baffle opening for the plasma discharge and shading off the evaporation-inactive part correspondingly from the plasma discharge and a drive moving the baffle opening in relation to said cathode material surface.

21. The electrode arrangement in claim 20 wherein said baffle opening is stationary in relation to said anode arrangement.

22. The electrode arrangement in claim 21 wherein said cathode material surface is in the form of a peripheral cylinder face of a cathode material body which is able to be turned by the drive about an axis of said cylinder face.

23. The electrode arrangement in claim 22 wherein said cathode material surface is in the form of an annular face of a cathode material body which is able to be turned by said drive about a central axis extending perpendicularly to the annular face.

24. The electrode arrangement in claim 22 wherein said cathode material surface is in the form of a linearly extending face of a cathode material body able to be reciprocated by said drive in a direction of extension of the face.

25. The electrode arrangement in claim 21 wherein said cathode material surface is in the form of an annular face of a cathode material body which is able to be turned by said drive.

26. The electrode arrangement in claim 21 wherein said cathode material surface is in the form of a linearly extending face of a cathode material body able to be reciprocated by said drive.

27. The electrode arrangement in claim 21 wherein said baffle opening fits like a hood at least partially around said cathode material surface for the formation of said evaporation-inactive part, which does not support the formation of the plasma discharge.

28. The electrode arrangement in claim 20 wherein said cathode material surface is in the form of a peripheral cylinder face of a cathode material body which is able to be turned by the drive about an axis of said cylinder face.

29. The electrode arrangement in claim 20 wherein said baffle opening fits like a hood at least partially around said cathode material surface for the formation of said evaporation-inactive part, which does not support the formation of the plasma discharge.

30. The electrode arrangement in claim 20 including a gas supply for a protect gas is so introduced into an intermediate space between the baffle arrangement and the cathode material surface that the supplied protective gas escapes at least partially through the baffle opening toward the plasma discharge from the intermediate space between the cathode material surface and the baffle arrangement.

31. The electrode arrangement in claim 30 wherein the protective gas is supplied on the rear side, facing away from the baffle opening, of the cathode material surface.

32. The electrode arrangement in claim 20 wherein said cathode material surface is in the form of a convex surface of a cathode material body so that said evaporation-active face is formed on an area directed toward said anode material surface.

33. The electrode arrangement in claim 32 wherein the orientation of said cathode material body may be changed by said drive in relation to the anode material surface.

* * * * *

UNITED STATES PATENT AND TRADEMARK OFFICE
CERTIFICATE OF CORRECTION

PATENT NO. : 6,881,270 B1 Page 1 of 1
DATED : April 19, 2000
INVENTOR(S) : Thomas Gebele et al.

It is certified that error appears in the above-identified patent and that said Letters Patent is hereby corrected as shown below:

<u>Title page,</u>
Item [57], ABSTRACT,
Line 6, "he" should be -- the --.

<u>Column 5,</u>
Line 15, "PC/EP" should be -- PCT/EP --.

<u>Column 7,</u>
Line 62, "thc" should be -- the --.

<u>Column 8,</u>
Line 1, "Thc" should be -- The --.
Line 33, "font" should be -- front --.

<u>Column 9,</u>
Line 44, insert -- . -- after "part".
Line 60, "thc" should be -- the --.
Line 62, "or thc" should be -- of the --.

<u>Column 10,</u>
Line 3, "sure" should be -- surface --.

Signed and Sealed this

Second Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,881,270 B1  Page 1 of 1
DATED : April 19, 2005
INVENTOR(S) : Thomas Gebele et al.

It is certified that error appears in the above-identified patent and that said Letters Patent is hereby corrected as shown below:

<u>Title page,</u>
Item [57], ABSTRACT,
Line 6, "he" should be -- the --.

<u>Column 5,</u>
Line 15, "PC/EP" should be -- PCT/EP --.

<u>Column 7,</u>
Line 62, "thc" should be -- the --.

<u>Column 8,</u>
Line 1, "Thc" should be -- The --.
Line 33, "font" should be -- front --.

<u>Column 9,</u>
Line 44, insert -- . -- after "part".
Line 60, "thc" should be -- the --.
Line 62, "or thc" should be -- of the --.

<u>Column 10,</u>
Line 3, "sure" should be -- surface --.

This certificate supersedes Certificate of Correction issued May 2, 2006.

Signed and Sealed this

Twenty-third Day of May, 2006

JON W. DUDAS
*Director of the United States Patent and Trademark Office*